(12) United States Patent
Landwehr et al.

(10) Patent No.: US 6,285,697 B1
(45) Date of Patent: Sep. 4, 2001

(54) SEMICONDUCTOR LASER COMPONENT

(75) Inventors: Gottfried Landwehr; Markus Keim; Günter Reuscher; Thomas Litz, all of Würzburg; Thierry Baron, Gerbrunn; Frank Fischer, Würzburg; Hans-Jürgen Lugauer, Weuzenbach, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/364,896

(22) Filed: Aug. 2, 1999

Related U.S. Application Data

(63) Continuation of application No. PCT/DE98/00264, filed on Jan. 29, 1998.

(30) Foreign Application Priority Data

Jan. 31, 1997 (DE) .............................................. 197 03 612

(51) Int. Cl.$^7$ ...................................................... H01S 5/00
(52) U.S. Cl. .................................................. 372/45; 372/46
(58) Field of Search ................................ 372/43, 44, 45; 257/76

(56) References Cited

U.S. PATENT DOCUMENTS

| | | | |
|---|---|---|---|
| 5,010,374 | 4/1991 | Cooke et al. | 372/45 |
| 5,338,944 | 8/1994 | Edmond et al. | 257/76 |
| 5,541,949 | 7/1996 | Bhat et al. | 372/45 |

FOREIGN PATENT DOCUMENTS

| | | |
|---|---|---|
| 0227865A1 | 7/1987 | (EP) . |
| 0610893A2 | 8/1994 | (EP) . |
| 0709939A1 | 5/1996 | (EP) . |

OTHER PUBLICATIONS

Published International Application No. 97/20353 (Ashley et al.), dated Jun. 5, 1997.

"Die physikalischen Grundlagen der LED's, Diodenlaser und pn–Photodioden", Halbleiter–Optoelektronik, Wolfgang Bludau, Carl Hauser Verlag München Wien, 1995, pp. 182–187.

"Buried tunnel contact junction AlGaAs–GaAs–InGaAs quantum well heterostructure lasers with oxide–defined lateral currents", J.J. Wierer et al., Appl. Phys. Lett. 71 (16), Oct. 1997, pp. 2286–2288.

"Carrier and Photon dynamics in transversally asymmetric high–speed AlGaInAs/InP MQW lasers", H. Hillmer et al., Physics and Simulation of Optoelectronic Devices IV, SPIE, vol. 2693, Sep. 1996, pp. 352–368.

"n–p($p^+n^+$)–n $Al_yGa_{1-y}As$–GaAs–$In_xGa_{1-x}As$ quantum–well laser with $p^{30}$–$n^+$ GaAs–InGaAs tunnel contact on n–GaAs", A.R. Sugg et al.,, Appl. Phys. Lett. 62 (20), May 1993, pp. 2510–2512.

*Primary Examiner*—Quyen P. Leung
(74) *Attorney, Agent, or Firm*—Herbert L. Lerner; Laurence A. Greenberg; Werner H. Stemer

(57) ABSTRACT

A semiconductor laser component includes a semiconductor body with an SCH configuration which is suitable for generating an electromagnetic radiation and in which an active layer sequence with a quantum well structure is provided between a first outer cover layer of a first conductivity type and a second outer cover layer of the first conductivity type. A first denatured transition layer of a second conductivity type and a second denatured transition layer the first conductivity type are provided between the active layer sequence and the second outer cover layer.

24 Claims, 2 Drawing Sheets

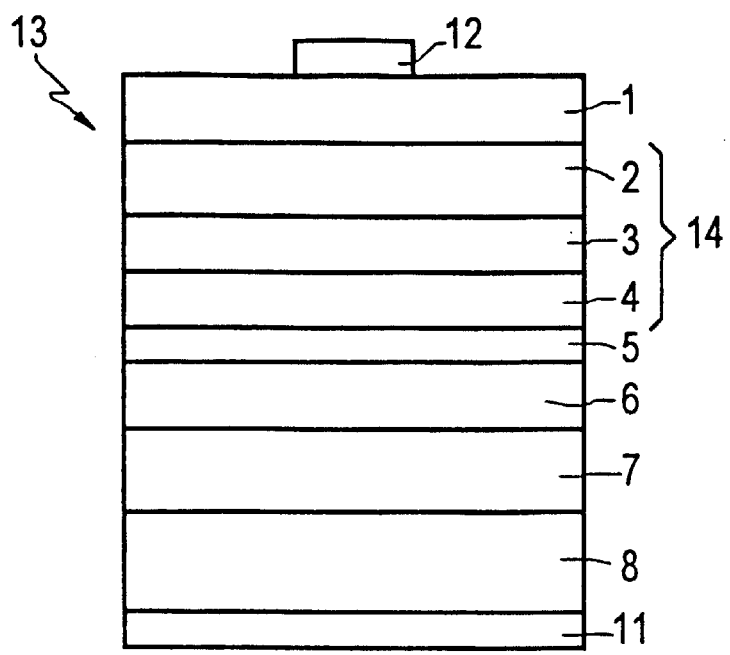
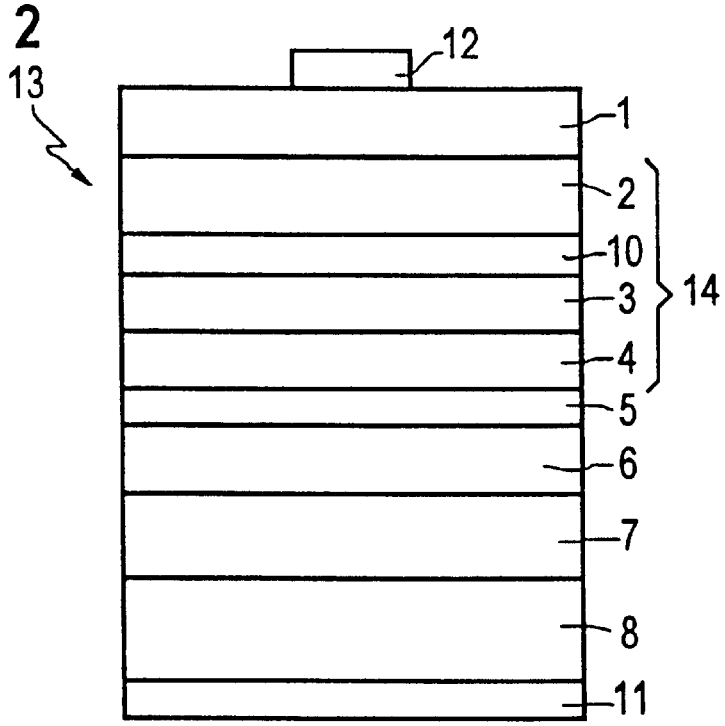

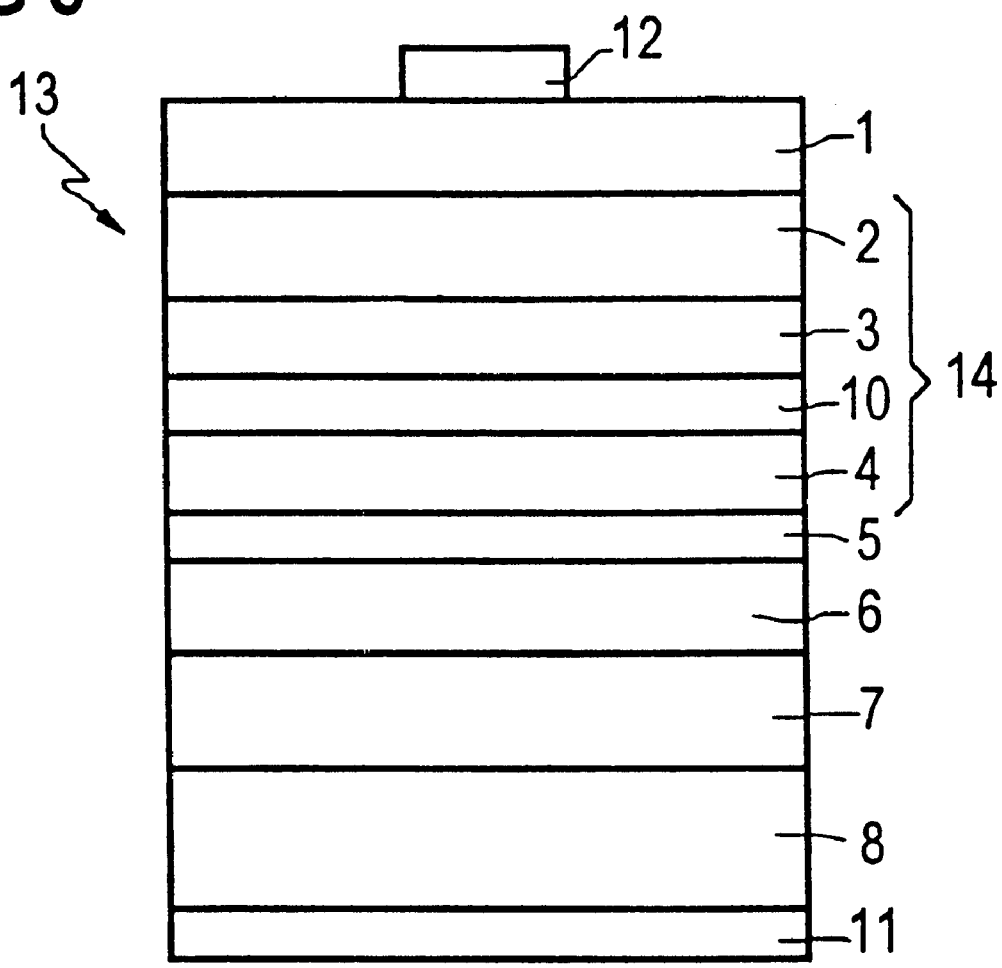

SEMICONDUCTOR LASER COMPONENT

CROSS-REFERENCE TO RELATED APPLICATION

This application is a continuation of copending International Application No. PCT/DE98/00264, filed Jan. 29, 1998, which designated the United States.

BACKGROUND OF THE INVENTION

Field of the Invention

The invention relates to a unipolar semiconductor laser component, including a semiconductor body with a heterostructure configuration, in particular an SCH (Separate Confinement Heterostructure) configuration, which is suitable for generating an electromagnetic radiation. In the configuration, an active layer sequence with a quantum well structure is provided between a first outer cover layer of a first conductivity type and a second outer cover layer of the first conductivity type above a semiconductor substrate. The electromagnetic radiation is generated within the quantum well structure (or active zone) when current flows through the semiconductor body. The cover layers have a lower index of refraction than the active layer sequence, and as a result an optical wave being generated during operation is confined between the cover layers. A laser diode is described in a paper entitled "Carrier and Photon Dynamics in Transversally Asymmetric High-Speed AlGaInAs/InP MQW Lasers", by H. Hillmer, A. Greiner, F. Steinhagen, H. Burkhard, R. Loesch, W. Schlapp and T. Kuhn, in Physics and Simulation of Optoelectronic Devices IV, SPIE, Vol. 2693 (1996), pp. 352–368. In that laser diode, an n-conducting cover layer of InP and over that an active layer sequence formed of InGaAs/AlInGaAs and a further cover layer of p-conducting InAlAs, are applied over a semiconductor substrate of semi-isolating or n-conducting InP. The active zone is formed of InGaAs multiple quantum wells (MQWs) which are embedded in AlInGaAs barriers and AlInGaAs waveguide layers. The AlInGaAs waveguide layers are both p-conducting, but at $p=5*10^{17}$ cm$^{-3}$, have lesser doping than the cover layers of InP (where $n=2*10^{18}$ cm$^{-3}$) or InAlAs (where $p=2*10^{18}$ cm$^{-3}$). The configuration disclosed by Hillmer et al is a so-called separate confinement heterostructure (SCH), in which electrons in holes are injected into an active zone through a pn junction which is formed substantially of the cover layers, in that case n-InP and p-InAlAs. The optical wave being generated is carried, regardless of the charge carrier confinement in the quantum wells, through the waveguide, which is surrounded by the cover layers with the lower index of refraction. In that special case, the active MQW zone is not symmetrical, or in other words placed centrally in the waveguide. The waveguide is shortened on the side toward the p-conducting cover layer, in order to speed up the transport of holes into the quantum well, since holes in principle have markedly lesser mobility than electrons. Improved modulability is thus attained, which is determined essentially by the transport of less mobile holes within the moderately doped waveguide and by the electron confinement in the MQW structure.

The basic structures of quantum well and MQW semiconductor lasers and of the SCH configuration are described, for instance, in a book entitled "Die physikalischen Grundlagen der LED's, Diodenlaser und pn-Photodioden" [The Physical Basis of LED's, Diode Lasers and pn-Photodiodes] by W. Buldau, in Halbleiter-Optoelektronik [Semiconductor Optoelectronics], Hanser-Verlag, Munich and Vienna, 1995, pp. 182–187, and are therefore not described in further detail herein.

In lasers based on the materials InGaAsP and AlInGaAs that have been tested thus far, the hole mobility in the waveguide layer is markedly less than the mobility of electrons.

In order to provide a high data transmission rate at wavelengths of 1.3 µm and 1.55 µm in the optical window of conventional glass fibers, a limitation to high-frequency modulability is presented by the drift transport of less-mobile holes into the quantum well and the electron confinement in the MQW structure.

Due to the aforementioned shortening of the waveguide layer on the p side, the transport length for holes in the waveguide can be shortened. However, the drift speed is determined by the electrical field applied and by the poor mobility.

SUMMARY OF THE INVENTION

It is accordingly an object of the invention to provide a semiconductor laser component, which overcomes the hereinafore-mentioned disadvantages of the heretofore-known devices of this general type, which has improved operability in comparison with the above-described known semiconductor laser component and which, in particular, has improved high-frequency modulability at wavelengths in a range between 1.3 µm and 1.55 µm.

With the foregoing and other objects in view there is provided, in accordance with the invention, a semiconductor laser component, comprising a semiconductor body having a heterostructure configuration suitable for generating an electromagnetic radiation, the heterostructure configuration including: a semiconductor substrate; a first outer cover layer of a first conductivity type disposed above the semiconductor substrate; a second outer cover layer of the first conductivity type disposed above the semiconductor substrate; an active zone layer sequence with a quantum well structure disposed between the first and second outer cover layers, for generating the electromagnetic radiation in the quantum well structure when current flows through the semiconductor body; and a charge carrier injector for accelerating charge carriers within an internal electrical field and thereby injecting the charge carriers rapidly into the active zone, the charge carrier injector having a first highly doped denatured transition layer (for instance $n^+$ or $p^+$) of a second conductivity type opposite the first conductivity type and a second highly doped denatured transition layer (such as $p^+$ or $n^+$) of the first conductivity type, disposed between the active layer sequence and the second outer cover layer, the second highly doped denatured transition layer disposed between the first highly doped denatured transition layer and the second outer cover layer.

The terms highly n-doped (or $n^+$-doped) and highly p-doped (or $p^+$-doped), or in other words denatured doping, are each advantageously understood to mean a dopant concentration of $\geq 10^{17}$ cm$^{-3}$.

The $n^+p^+$ layer sequence acts as a "hole injector", by which electrons near the active zone are converted into holes and are accelerated in the electrical field. Consequently, through the use of this $n^+p^+$ layer sequence, which is polarized in reverse relative to the component, charge carriers within an internal electrical field are accelerated in the $n^+p^+$ layer sequence and injected more quickly into the active zone. The $n^+p^+$ layer sequence functions as a source for charge carriers inside the cover layers.

In the charge carrier injector, at the distance of one Debye length around the junction, a genuine reversal of the conductivity type occurs. In other words, the Fermi level is put in the conduction band by n-doping on one side of the diode, and holes pull the Fermi level into the valence band by p-doping on the opposite side (this is known as "denaturing"). Due to the very narrow space charge zone, which is only a few angstroms wide, between these regions of denatured doping in the charge carrier injector, reverse polarity can lead to interband tunnels of electrons out of the valence band of the p-doped semiconductor in conditions of the conduction band of the n-doped semiconductor, as a result of which holes are created in the p-doped region.

In accordance with another feature of the invention, a barrier layer of an arbitrary conductivity type that is lesser doped than the transition layers is disposed between the first highly doped denatured transition layer and the second highly doped denatured transition layer. This barrier layer may form a barrier for electrons that extend past the active zone.

In accordance with a further feature of the invention, a thin barrier layer for electrons that has lesser doping than the transition layers is disposed between the first highly doped denatured transition layer and the quantum well structure. The thin barrier layer is intended to prevent electrons that drift past the active zone from draining out into the highly doped denatured transition layers ($p^+n^+$ structure).

In the semiconductor laser component of the invention, and in particular in the two embodiments discussed last above, charge carriers are accelerated in an electrical field that, given forward polarity of the laser diode, forms in the depletion zone of the highly doped denatured transition layers (=$p^+(n)$ $n^+$ diode), which in this case is polarized in the depletion direction. As a result, very much higher drift speeds are attained than are attained in known semiconductor laser components of the type defined at the outset. Furthermore, electrons are prevented from being drawn out of the region of the active zone and causing charge accumulations.

The barrier layer preferably is formed of a material that has a greater band gap than the material of the spacer layer. In particular, the barrier layer forms a barrier for electrons that extend past the active zone and the spacer layer.

In accordance with an added feature of the invention, the semiconductor laser component is an SCH quantum well or MQW laser, in which the active zone, waveguide layers and cover layers, and the transition layers have semiconductor material selected from the group of III–V semiconductor materials.

Especially preferred materials in this case are $In_xGa_{1-x}As_yP_{1-y}$ ($0 \leq x \leq 1$, $0 \leq y \leq 1$) or $Al_xGa_yIn_{1-x-y}As$ ($0 \leq x \leq 1$, $0 \leq y \leq 1$, $x+y \leq 1$) for the cover and waveguide layers, and $In_xGa_{1-x}As_yP_{1-y}$ ($0 \leq x \leq 1$, $0 \leq y \leq 1$) or $Al_xGa_yIn_{1-x-y}As$ ($0 \leq x \leq 1$, $0 \leq y \leq 1$, $x+y \leq 1$) for the active zone. Above all, materials that grow in braced form on the InP substrate or some other layer are provided. The highly doped transition layers can also be formed of $In_xGa_{1-x}As_yP_{1-y}$ ($0 \leq x \leq 1$, $0 \leq y \leq 1$) or $Al_xGa_yIn_{1-y}As$ ($0 \leq x \leq 1$, $0 \leq y \leq 1$, $x+y \leq 1$). The "injector configuration" of the $n^+p^+$ diode can be integrated with the waveguide, if the index of refraction of these transition layers is adapted to the function of a waveguide, and in particular if the index of refraction is greater than in the outer cover layers and less than in the region of the quantum well structure.

In accordance with an additional feature of the invention, the spacer layer between the first highly doped denatured transition layer and the quantum well structure is from 150 nm to 10 nm thick and can be formed of undoped or weakly doped semiconductor material.

In accordance with a concomitant feature of the invention, the highly doped denatured transition layers are between 50 nm and 5 nm thick, and the lesser-doped barrier layer can be up to 200 nm thick.

In the configuration of a semiconductor laser component according to the invention, holes are accelerated in a secondary electrical field and thus traverse the short distance in the waveguide as far as the quantum well structure faster. Furthermore, electrons are prevented from extending too far past the region of the active zone.

Other features which are considered as characteristic for the invention are set forth in the appended claims.

Although the invention is illustrated and described herein as embodied in a semiconductor laser component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, elevational view of a layer structure of a first exemplary embodiment of the invention;

FIG. 2 is an elevational view of a layer structure of a second exemplary embodiment of the invention; and FIG. 3 is an elevational view of a layer structure of a third exemplary embodiment of the invention.

DESCRIPTION OF THE PREFERRED EMBODIMENTS

Referring now to the figures of the drawings in detail and first, particularly, to FIG. 1 thereof, there is seen a semiconductor body 13 that is a semiconductor body of an SCH quantum well semiconductor laser, in which a first outer cover layer 7 of a first conductivity type is applied over a semiconductor substrate 8 that, for instance, is formed of conductively doped or semi-isolating InP. This cover layer 7 is formed of highly doped denatured InP ($n^+$ or $p^+$), for instance. The semiconductor substrate optionally has the same conductivity type as the first outer cover layer 7.

This first outer cover layer 7 is followed by a first waveguide layer 6, which may be undoped. The first waveguide layer 6 may be of the first conductivity type or of a second conductivity type opposite the first and it likewise is formed of p-InGaAlAs.

A quantum well structure 5, for instance being formed of undoped InGaAs, is applied over the first waveguide layer 6. A thin spacer layer 4 which is located on the quantum well structure 5 is of the second conductivity type or is undoped and is formed, for instance, of p-InGaAlAs.

The spacer layer 4 is adjoined by a first highly doped denatured transition layer 3 of the second conductivity type, over which a second highly doped denatured transition layer 2 of the first conductivity type is located in turn. The first highly doped denatured transition layer 3 is, for instance, a $p^+$-InGaAlAs layer, and the second highly doped denatured transition layer 2 is, for instance, a $n^+$-InGaAlAs layer. In conclusion, a second outer cover layer 1 of the first conductivity type is disposed over the second highly doped denatured transition layer 2 and is formed, for instance, of n-InGaAlAs.

The layer sequence formed of the first highly doped denatured transition layer 3 and the second highly doped denatured transition layer 2 ($p^+n^+$ diode) acts as an injector. The layer sequence formed of the spacer layer 4, the first highly doped denatured transition layer 3 and the second highly doped denatured transition layer 2 acts as a second waveguide layer 14.

First and second contact metallizings 11 and 12 are applied in order to provide electrical contacting of the semiconductor body 13. The first contact metallizing 11 (ohmic back side contact) is applied to a main surface of the semiconductor substrate 8, which is opposite the first outer cover layer 7. The second contact metallizing 12 (ohmic front side contact, such as a sequence Ti/Pt/Au) is applied over a main surface of the second outer cover layer 1, which is opposite the second highly doped denatured transition layer 2. These contact metallizings 11, 12 are formed of materials conventionally used in semiconductor technology for the various semiconductor materials employed. The first contact metallizing 11 can be connected directly to the first outer cover layer 7, if a semi-isolating semiconductor substrate 8 is used.

FIG. 2 shows a semiconductor body 13 of an SCH quantum well semiconductor laser, in which a first outer cover layer 7 (such as $n^+$-InP), a first waveguide layer 6 (such as p-InGaAlAs), a quantum well structure 5 (such as InGaAs), a spacer layer 4 (such as p-InGaAlAs) and a first highly doped denatured transition layer 3 (such as $p^+$-InGaAlAs), are disposed on a semiconductor substrate 8 (such as semi-isolating InP), analogously to the exemplary embodiment of FIG. 1. Unlike the exemplary embodiment of FIG. 1, in this case a thin barrier layer 10, which is of the first or second conductivity type and has lower doping than the transition layer 3, is first applied over the first highly doped denatured transition layer 3. This barrier layer 10 is formed, for instance, of n-InGaAlAs. The second highly doped denatured transition layer 2 (for instance being formed of $n^+$-InGaAlAs) is applied over this lower-doped barrier layer 10, and the second outer cover layer 1 (for instance being formed of $n^+$-InGaAlAs) is applied over the second highly doped denatured transition layer 2. The material of the barrier layer 10 preferably has a greater band gap than the material of the spacer layer 4. In particular, the barrier layer 10 forms a barrier for electrons that extend past the active zone and the spacer layer 4. The layer sequence that is formed of the spacer layer 4, the first highly doped denatured transition layer 3, the barrier layer 10 and the second highly doped denatured transition layer 2, acts as the second waveguide layer 14 in this case.

As in the case of the semiconductor body 13 of the exemplary embodiment of FIG. 1, in this case again the semiconductor substrate 8 is provided with a first contact metallizing 11, and the second outer cover layer 1 is provided with a second contact metallizing 12.

The exemplary embodiment of FIG. 3 differs from the exemplary embodiment of FIG. 1 in that an additional barrier layer 10 of the second conductivity type (such as p-InGaAlAs) is applied over the spacer layer 4. This barrier layer 10 is adjoined by the first highly doped denatured transition layer 3, the second highly doped denatured transition layer 2 and the second outer cover layer 1. The barrier layer 10 preferably is formed of a material which has a greater band gap than the material of the spacer layer 4. In particular, the barrier layer 10 forms a barrier for electrons that extend past the active zone and the spacer layer 4. Once again, the layer sequence formed of the spacer layer 4, the barrier layer 10 and the respective first and second highly doped denatured transition layers 3 and 2, acts as the second waveguide layer 14.

It is understood that the description of the semiconductor laser component of the invention in terms of these exemplary embodiments is not to be taken as a limitation of the invention to those exemplary embodiments. Semiconductor lasers according to the invention can be equally formed on the basis of other mixed crystal systems, such as semiconductor crystals formed of the mixtures of the binary semiconductors GaSb, InSb, InAs, GaAs, AlAs, InP, and GaP.

Instead of the p-doped outer cover layers 7, 1 described as examples, n-doped outer cover layers 7, 1 may also be provided. The conductivity types of the transition layers 3, 2, of the spacer layer 4 (if doped), and in the exemplary embodiment of FIG. 3 of the barrier layer 10, are then the opposite of what is given in the above-described explicit examples for the layer materials.

In addition to InP, it is also possible to use Si, GaAs, GaSb or other III–V semiconductors as the substrate.

We claim:

1. A semiconductor laser component, comprising:
a semiconductor body having a heterostructure configuration suitable for generating an electromagnetic radiation, said heterostructure configuration including:
a semiconductor substrate;
a first outer cover layer of a first conductivity type disposed above said semiconductor substrate;
a second outer cover layer of the first conductivity type disposed above said semiconductor substrate;
an active zone layer sequence with a quantum well structure disposed between said first and second outer cover layers, for generating the electromagnetic radiation in said quantum well structure when current flows through said semiconductor body; and
a charge carrier injector for accelerating charge carriers within an internal electrical field and thereby injecting the charge carriers rapidly into said active zone layer, said charge carrier injector having a first highly doped denatured transition layer of a second conductivity type opposite the first conductivity type and a second highly doped denatured transition layer of the first conductivity type, disposed between said active layer sequence and said second outer cover layer, said second highly doped denatured transition layer disposed between said first highly doped denatured transition layer and said second outer cover layer.

2. The semiconductor laser component according to claim 1, wherein said denatured transition layers each have a thickness $\geq 5$ nm and $\leq 50$ nm.

3. The semiconductor laser component according to claim 1, including a barrier layer having an arbitrary conductivity type with lesser doping than said highly doped denatured transition layers, said barrier layer disposed between said first highly doped denatured transition layer and said second highly doped denatured transition layer as a barrier for electrons.

4. The semiconductor laser component according to claim 3, wherein said barrier layer has a thickness of at most 200 nm.

5. The semiconductor laser component according to claim 3, including an undoped spacer layer disposed between said first highly doped denatured transition layer and said quantum well structure of said active layer sequence, a first waveguide layer disposed between said quantum well structure and said first outer cover layer, and a second waveguide layer disposed between said quantum well structure and said second outer cover layer, said second waveguide layer formed by said denatured transition layers, said spacer layer and said barrier layer.

6. The semiconductor laser component according to claim 5, wherein said quantum well structure, said waveguide layers and said cover layers have III–V semiconductor materials.

7. The semiconductor laser component according to claim 1, including an undoped spacer layer disposed between said first highly doped denatured transition layer and said quantum well structure of said active layer sequence.

8. The semiconductor laser component according to claim 7, including an additional barrier layer of the second conductivity type disposed between said spacer layer and said first highly doped denatured transition layer as a barrier for electrons.

9. The semiconductor laser component according to claim 8, wherein said barrier layer has a thickness of at most 200 nm.

10. The semiconductor laser component according to claim 8, including a first waveguide layer disposed between said quantum well structure and said first outer cover layer, and a second waveguide layer disposed between said quantum well structure and said second outer cover layer, said second waveguide layer formed by said denatured transition layers, said spacer layer and said additional barrier layer.

11. The semiconductor laser component according to claim 10, wherein said quantum well structure, said waveguide layers and said cover layers have III–V semiconductor materials.

12. The semiconductor laser component according to claim 7, wherein said spacer layer has a thickness $\geq 10$ nm and $\leq 150$ nm.

13. The semiconductor laser component according to claim 7, including a first waveguide layer disposed between said quantum well structure and said first outer cover layer, and a second waveguide layer disposed between said quantum well structure and said second outer cover layer, said second waveguide layer formed by said denatured transition layers and said spacer layer.

14. The semiconductor laser component according to claim 13, wherein said quantum well structure, said waveguide layers and said cover layers have III–V semiconductor materials.

15. The semiconductor laser component according to claim 1, including a spacer layer of lesser doping than said transition layers of the second conductivity type, said spacer layer disposed between said first highly doped denatured transition layer and said quantum well structure of said active layer sequence.

16. The semiconductor laser component according to claim 15, including an additional barrier layer of the second conductivity type disposed between said spacer layer and said first highly doped denatured transition layer as a barrier for electrons.

17. The semiconductor laser component according to claim 16, wherein said barrier layer has a thickness of at most 200 nm.

18. The semiconductor laser component according to claim 16, including a first waveguide layer disposed between said quantum well structure and said first outer cover layer, and a second waveguide layer disposed between said quantum well structure and said second outer cover layer, said second waveguide layer formed by said denatured transition layers, said spacer layer and said additional barrier layer.

19. The semiconductor laser component according to claim 18, wherein said quantum well structure, said waveguide layers and said cover layers have III–V semiconductor materials.

20. The semiconductor laser component according to claim 15, wherein said spacer layer has a thickness $\geq 10$ nm and $\leq 150$ nm.

21. The semiconductor laser component according to claim 15, including a first waveguide layer disposed between said quantum well structure and said first outer cover layer, and a second waveguide layer disposed between said quantum well structure and said second outer cover layer, said second waveguide layer formed by said denatured transition layers and said spacer layer.

22. The semiconductor laser component according to claim 21, wherein said quantum well structure, said waveguide layers and said cover layers have III–V semiconductor materials.

23. The semiconductor laser component according to claim 1, including a first waveguide layer disposed between said quantum well structure and said first outer cover layer, and a second waveguide layer disposed between said quantum well structure and said second outer cover layer.

24. The semiconductor laser component according to claim 1, wherein said denatured transition layers have a dopant concentration $\geq 10^{17}$ cm$^{-3}$.

* * * * *